United States Patent
Honda et al.

(10) Patent No.: US 8,298,999 B2
(45) Date of Patent: Oct. 30, 2012

(54) HARD COATING FILM EXCELLENT IN LUBRICATION CHARACTERISTICS, PROCESS FOR FORMATION THEREOF, AND TOOL FOR THE PLASTIC WORKING OF METAL

(75) Inventors: Fumiaki Honda, Yasugi (JP); Ken Inoue, Yasugi (JP); Kenichi Inoue, Yasugi (JP)

(73) Assignee: Hitachi Metals, Ltd., Tokyo (JP)

( * ) Notice: Subject to any disclaimer, the term of this patent is extended or adjusted under 35 U.S.C. 154(b) by 666 days.

(21) Appl. No.: 12/439,921

(22) PCT Filed: Dec. 21, 2007

(86) PCT No.: PCT/JP2007/074641
§ 371 (c)(1),
(2), (4) Date: Mar. 4, 2009

(87) PCT Pub. No.: WO2008/078675
PCT Pub. Date: Jul. 3, 2008

(65) Prior Publication Data
US 2010/0210489 A1  Aug. 19, 2010

(30) Foreign Application Priority Data

Dec. 25, 2006 (JP) ................. 2006-347081
Jul. 31, 2007 (JP) ................. 2007-198941

(51) Int. Cl.
*C04B 35/52* (2006.01)
*F16C 33/20* (2006.01)

(52) U.S. Cl. ...................... 508/109; 508/108

(58) Field of Classification Search .......... 508/108, 508/109
See application file for complete search history.

(56) References Cited

U.S. PATENT DOCUMENTS 4,917,961 A * 4/1990 Tsujii et al. .......... 428/552
(Continued)

FOREIGN PATENT DOCUMENTS
JP  58-006971 A  1/1983
(Continued)

OTHER PUBLICATIONS

"Technical Information Site governed by National Institute of Advanced Industrial Science and Technology of Independent Administrative Agency", Technoknowledge Network, 2006.

(Continued)

*Primary Examiner* — Jim Goloboy
(74) *Attorney, Agent, or Firm* — Sughrue Mion, PLLC

(57) ABSTRACT

The invention aims at providing a hard coating film excellent in lubrication characteristics; a process for the formation thereof; and tools for the plastic working of metal, and provides a hard coating film covering the surface of a substrate to come into contact with other member, wherein carbon atoms having carbon-carbon bonds are present in an amount of 10 at % or above. It is preferable that the hard coating film contain titanium carbide, while it is preferable to form a titanium nitride coating layer between the surface of the substrate and the hard coating film. The invention also provides a process for the formation of a hard coating film on the surface of a substrate by arc ion plating which comprises introducing a hydrocarbon gas during the arc ion plating with a metal target and which makes it possible to form on the surface of a substrate a coating film where carbon atoms having carbon-carbon bonds are present in an amount of 10 at % or above. It is preferable that prior to the introduction of a hydrocarbon gas, nitrogen gas be introduced to form a metal nitride layer on the surface of the substrate. Further, the invention provides tools for the plastic working of metal whose working surfaces are covered with the hard coating film.

12 Claims, 1 Drawing Sheet

U.S. PATENT DOCUMENTS

| | | |
|---|---|---|
| 2003/0129407 A1 | 7/2003 | Teer et al. |
| 2006/0246290 A1* | 11/2006 | Oda et al. ............. 428/408 |
| 2007/0082129 A1 | 4/2007 | Shimoda et al. |

FOREIGN PATENT DOCUMENTS

| | | | |
|---|---|---|---|
| JP | 10-251830 A | | 9/1998 |
| JP | 11-267906 A | | 10/1999 |
| JP | 11267906 A | * | 10/1999 |
| JP | 2000-107909 A | | 4/2000 |
| JP | 2000107909 A | * | 4/2000 |
| JP | 2000-144378 A | | 5/2000 |
| JP | 2002-038255 A | | 2/2002 |
| JP | 2002-371352 A | | 12/2002 |
| JP | 2007-160465 A | | 6/2007 |

OTHER PUBLICATIONS

K.K. Toyokoka Home Page "Internet <URL:http://www.toyokoka.com/bumon/arkion/arkion.htm", 2003.

S. W. Huang, et al., "Friction and wear of TiCN coatings deposited by filtered arc", US DOE Rep, 1998, pp. 148-150.

S. W. Huang, et al., "Tribological Behaviour and microstructure of $TiC_xN_{(1-x)}$ coatings deposited by filtered arc", Wear, 2002, pp. 566-579, vol. 252, No. 7/8.

Japanese Office Action issued in Application No. 2007-328382 dated May 7, 2012.

* cited by examiner

US 8,298,999 B2

HARD COATING FILM EXCELLENT IN LUBRICATION CHARACTERISTICS, PROCESS FOR FORMATION THEREOF, AND TOOL FOR THE PLASTIC WORKING OF METAL

CROSS REFERENCE TO RELATED APPLICATION

This application is a 371 National Phase of PCT/JP2007/074641 filed Dec. 21, 2007, claiming the priority of Japanese Patent Application No. 2006-347081 filed Dec. 25, 2006, and Japanese Patent Application No. 2007-198941 filed Jul. 31, 2007, the disclosures of which are hereby incorporated by reference.

TECHNICAL FIELD

The present invention relates to a hard coating film excellent in lubrication characteristics, which is, for example, a functional coating film covered on the working surface coming into contact with other member in jigs and tools such as mold, and a process for formation of the coating film. It further relates to a tool for plastic working of metal covered with the hard coating film on its working surface.

BACKGROUND ART

Hitherto, for example, in the case of jig and tool used for plastic working of metal, the working surface thereof is seriously damaged due to vigorous sliding with material to be worked. Thus, it has been attempted to increase wear resistance by subjecting the working surface of jig and tool to some surface treatments. Among them, coating technology greatly contributes to improvement of life of molds and cutting tools since it can form a hard coating film having a Vickers hardness exceeding 1000 HV on the surface of a substrate with high adhesion.

However, in such jigs and tools, particularly, it is highly effective to increase not only the wear resistance of the surface, but also the lubrication characteristics so as to inhibit cohesion of the material to be worked, as in the working environment of the above-mentioned tools for plastic working. For solving this problem, for example, carbide of titanium (Ti) is positively utilized in the surface coating film of jigs and tools because it has both high wear resistance and sliding characteristics. The coating film of titanium carbide is formed mainly by chemical vapor deposition method (CVD method) (Non-Patent Document 1), and it is formed also by arc ion plating method which is a kind of physical vapor deposition method (PVD method) (Non-Patent Document 2). Furthermore, for formation of coating film of vanadium carbide (VC), it has also been proposed to employ the arc ion plating method (Patent Document 1) in addition to the conventional TD treatment.

Non-Patent Document 1: Technoknowledge• Network (2006) [Technical Information Site governed by National Institute of Advanced Industrial Science and Technology of Independent Administrative Agency] (Internet <URL: http://www.techno-qanda. net/dsweb/Get/Document-5294>)

Non-Patent Document 2: K. K. Toyokoka Home Page (2003) (Internet <URL: http://www. toyokoka. com/bumon/arkion/arkion.htm>)

Patent Document 1: JP-A-2002-371352

DISCLOSURE OF INVENTION

Problem to be Solved by the Invention

The conventional hard coating films proposed in Non-Patent Documents 1 and 2 have both high wear resistance and sliding characteristics, but coating film characteristics of higher level are now demanded in using of jig and tool in recent manufacturing industries where curtailment of production cost has been strongly demanded for cost reduction. Particularly, it becomes a great problem for further increase of jig and tool life to further enhance the lubrication characteristics of the coating film and inhibit cohesion of material to be worked.

Therefore, the present invention provides a hard coating film having higher lubrication characteristics which have not been obtained by the conventional processes; a process for producing the hard coating film, and a tool for plastic working of metal in which the above hard coating film is coated on the working surface.

Means for Solving the Problem

The inventors have conducted detailed researches for attaining the hard coating film having lubrication characteristics higher than those of conventional coating films. As a result, it has been found that even the conventional hard coating films, lubrication characteristics thereof are remarkably improved when carbon-carbon bond structure is present in the film in a specific amount or more. Furthermore, in addition to the innovative finding, preferable production conditions for allowing a specific amount of carbon-carbon bond to be present in the film have also been established. Thus, the present invention has been accomplished.

That is, the present invention provides a hard coating film covering the surface of a substrate to come into contact with other member, wherein carbon atoms having carbon-carbon bonds are present in an amount of 10 at % or more, preferably 30 at % or less. It is desirable that the carbon atoms include both carbon atoms having a crystal structure of $sp^2$ and carbon atoms having a crystal structure of $sp^3$.

In this case, it is preferred that the kind of the hard coating film is a metal carbide or a metal carbonitride, and furthermore, it is preferred that the amount of carbon constituting the compound is 20 at % or more. The metal carbide or metal carbonitride is more preferably titanium carbide or titanium carbonitride. Furthermore, it is preferred to form a coating film comprising a metal nitride, specifically, titanium nitride between the surface of the substrate and the hard coating film. Moreover, it is preferred that the concentration of oxygen in the hard coating film is 15 at % or less.

In addition, the present invention relates to a process for the formation of a hard coating film excellent in lubrication characteristics on the surface of a substrate by arc ion plating which comprises introducing a hydrocarbon gas during the arc ion plating with a metal target to form on the surface of a substrate a coating film where carbon atoms having carbon-carbon bonds are present in an amount of 10 at % or more. It is preferred that prior to the introduction of a hydrocarbon gas, nitrogen gas is introduced to form a coating film comprising a metal nitride on the surface of the substrate.

In this case, it is preferred that amount of the nitrogen gas present in the hydrocarbon gas introduced is controlled to 0.2 or less in the ratio of nitrogen gas flow rate/hydrocarbon gas flow rate. Furthermore, it is preferred that the flow rate of the hydrocarbon gas introduced is adjusted with respect to capacity of the arc ion plating apparatus to hydrocarbon gas flow rate/apparatus capacity=$0.8\times10^{-5}$–$1.5\times10^{-5}$ ($s^{-1}$). Simultaneously, it is preferred to control the flow rate of hydrocarbon gas per se to $1.0\times10^{-5}$ ($m^3$/s) or more. Furthermore, it is preferred that the metal target used is Ti target and/or the hydrocarbon gas is methane gas.

Further, the present invention relates to a tool for plastic working of metal whose working surface is covered with the hard coating film.

Advantages of the Invention

According to the present invention, it is possible to produce a hard coating film having lubrication characteristics higher than those of the conventional coating films while having the same basic substrate constitution as those of the conventional coating films and necessitating no especially expensive apparatuses for the formation of the coating film. Moreover, tools for plastic working of metal where the above hard coating film excellent in lubrication characteristics is applied to the working surface.

BEST MODE FOR CARRYING OUT THE INVENTION

The ultimate feature of the present invention is that carbon atoms having carbon-carbon bonds are allowed to be present in the hard coating film, whereby the lubrication characteristics can be conspicuously improved. Further features are that arc ion plating method which is a kind of PVD method is employed as a method for the formation of the coating film and a hydrocarbon gas is positively introduced into the gas atmosphere during formation of the coating film, and besides the flow rate of the hydrocarbon gas per se is controlled depending on the capacity of apparatus (reaction chamber).

First, as to the constitution of "carbon atoms having carbon-carbon bonds" introduced into the hard coating film of the present invention, this means diamond, graphite or DLC (diamond-like carbon) comprising so-called $sp^2$ and/or $sp^3$ bond structure of carbon atoms. Diamond having $sp^3$ structure is excellent in hardness and graphite having $sp^2$ structure is excellent particularly in lubrication, and thus when carbon atoms having these bond structures are dispersed, for example, in conventional modified coating films such as of metal carbide/nitride/carbonitride, further high lubrication characteristics can be added to the basic characteristics of the conventional coating films. Among these coating films, metal carbide coating films such as of titanium carbide (TiC) are advantageous for obtaining bond structure of carbon-carbon since the atmosphere in the formation of these coating films is rich in carbon (C), and thus are preferred as embodiments which can attain high hardness of as high as 3000 HV and excellent lubrication characteristics.

In the present invention, it is necessary for obtaining sufficient lubrication characteristics that the carbon atoms having carbon-carbon bonds are present in an amount of 10 at % or more in the coating film. The amount of the carbon atoms is preferably 30 at % or less for inhibiting damages of characteristics of the base coating film per se. In quantitative and qualitative measurement, there can be utilized analysis of the coating film surface which comprises use of, for example, Raman spectroscopic method and X-ray photoelectric spectroscopic method (XPS) in combination. That is, according to Raman spectroscopic method, presence of carbon-carbon bond structure of $sp^2$ or $sp^3$ can be accurately recognized in the analytical spectrum peaks which do not appear in usual coating films. Here, in the present invention, it is desired that both the crystal structures of $sp^2$ or $sp^3$ appear in the analytical spectrum peaks, namely, both the graphite of $sp^2$ structure and diamond of $sp^3$ structure are included or DLC having both the structures of $sp^2$ and $sp^3$ is included in the total amount of carbon atoms having carbon-carbon bonds. Upon confirming the presence of them, the amount of carbon atoms having carbon-carbon bonds in the coating film can be determined from XPS spectrum corresponding to the bond energy.

Furthermore, as for the conditions under which a hard coating film containing carbon atoms having carbon-carbon bonds in an amount of 10 at % or more can be readily formed on the surface of a substrate, a coating atmosphere advantageous for the formation can be provided by using a metal carbide or metal carbonitride for the hard coating film as mentioned above. In this case, when the hard coating film after formed is metal carbide or metal carbonitride, the film is excellent in mechanical strength in use, and hence sufficient effects and advantages can be exhibited. Specifically, a hard coating film containing 20 at % or more of carbon which forms metal carbide or metal carbonitride is satisfactory, and a hard coating film containing 25 at % or more is preferred.

Titanium is preferred as a metal constituting the carbide or carbonitride. Since titanium is high in ability to form carbide (carbonitride), and besides the formed titanium carbide (TiC) or titanium carbonitride (TiCN) is very high in hardness, a coating film having both the lubrication characteristics and high hardness can be formed due to the presence of carbon atoms contributing to formation of carbon-carbon bond in the titanium carbide (carbonitride). Among them, metal carbides (titanium carbide) which are formed in an atmosphere which is more rich in carbon (C) are further advantageous for obtaining bond structure of carbon-carbon, and thus are preferred as embodiments which can attain high hardness of as high as 3000 HV and excellent lubrication characteristics.

If too much oxygen is contained in the hard coating film, it forms a large amount of metal oxide in the coating film, resulting in brittle coating film. Therefore, in the present invention, it is preferred to reduce the oxygen concentration in the hard coating film to 15 at % or less, considering that it is also an impurity.

Moreover, in the present invention, preferably, an intermediate coating film comprising a metal nitride is formed between the surface of the substrate and the hard coating film for further improvement in adhesion between them. In this case, the metal nitride mainly composed of metal element such as titanium or chromium can be used, and titanium nitride is preferred, taking into consideration the hardness thereof. If the hard coating film is of metal carbide or metal carbonitride, for further improvement of adhesion, the metal of the metal nitride is preferably the same as the metal constituting the hard coating film.

Furthermore, when titanium nitride which has a particular gold color is used for the intermediate coating film, and a hard coating film of different color is coated on the intermediate coating film, and if the hard coating film wears out, the layer of gold color is exposed and hence the wearing state (life) of the hard coating film per se can be known by the color. For this reason, it is preferred to use titanium nitride between the surface of the substrate and the hard coating film. For improvement of both the coating film characteristics and the capability of judging the wearing state by color, it is more preferred to use titanium carbide having silver color for the hard coating film.

Next, reasons for using arc ion plating method for the formation of coating film will be explained. Since the treating temperature is high in the conventionally widely utilized CVD method and salt bath treatment method such as TD treatment, the chemical reaction in production of material proceeds in the nearly equilibrium state and stable compound is produced. On the other hand, in the arc ion plating method, which utilizes plasma state, the reaction for production of material proceeds in such a state as including also non-equilibrium state. Therefore, an environment can be obtained where the carbon-carbon bond which cannot originally be stably present can be easily generated, and hence in the present invention, the arc ion plating method is an apparatus requirement which is difficult to be replaced with other methods. Thus, the carbon-carbon bond gives high lubrication characteristics to the hard coating film.

In order to realize the special coating film as mentioned above, it is also important to severely control the atmospheric gas components in arc ion plating. That is, in the present invention where hydrocarbon gas is introduced, it is important to control other necessary gases to be mixed and mixing ratio, and particularly, since nitrogen gas has an action to hinder the formation of carbon-carbon bond, care should be taken in case nitrogen gas must be mixed. That is, for providing a sufficient amount of carbon-carbon bond structure in the coating film, the proportion of nitrogen gas to hydrocarbon gas introduced can be mentioned as an important factor.

In the present invention, the above proportion of nitrogen gas can be adjusted by the ratio of gas flow rate of nitrogen gas and hydrocarbon gas (nitrogen gas flow rate/hydrocarbon gas flow rate), and it is preferred to control the value of ratio to 0.2 or less. When the value is 0.2 or less, the amount of carbon bond produced by non-equilibrium reaction can be sufficiently secured, and hence a hard coating film having sufficient sliding characteristics can be produced. In the case of providing a constitution of carbon-carbon bond in a metal carbide coating film such as of titanium carbide, it is desired that the gas introduced is substantially one kind of hydrocarbon gas and the amount of nitrogen gas (including the gas as an impurity) present together is controlled as small as possible.

However, even if a sufficient amount of carbon-carbon bond structure can be provided in the coating film, it is meaningless as a whole of hard coating film, unless overall characteristics (hardness and lubrication characteristics) including those of base coating film are attained. That is, in addition to the carbon atoms having carbon-carbon bonds, the amount of carbon bonds forming the base coating film per se (metal carbide, metal carbonitride) must be sufficiently ensured and is preferably 20 at % or more as aforementioned. Therefore, in order to satisfactorily adjust the carbon balance and provide a sufficient amount of lubricating carbon atoms in a sufficient amount of hard substrate coating film, it is effective in the present invention to carry out the following control of flow rate of the hydrocarbon gas per se depending on the capacity of arc ion plating apparatus.

The flow rate of the hydrocarbon gas introduced is preferably $0.8 \times 10^{-5} - 1.5 \times 10^{-5}$ $(s^{-1})$ in the value of hydrocarbon gas flow rate/apparatus capacity based on the apparatus of arc ion plating (namely, capacity of chamber in which substrate is charged). If the value is less than $0.8 \times 10^{-5}$ $(s^{-1})$, although lubricating carbon atoms in a sufficient amount may be formed, metal carbide or metal carbonitride which is preferred as a base hard coating film can hardly be obtained in a sufficient amount. If the value exceeds $1.5 \times 10^{-5}$ $(s^{-1})$, "soot" substance is produced in the chamber and on the surface of the coating film, which not only damages the appearance of product, but also makes unstable the arc discharge during arc ion plating and thus affects productivity.

The flow rate of the hydrocarbon gas per se upon satisfying the above-mentioned relation with capacity of chamber is preferably $1.0 \times 10^{-5}$ $(m^3/s)$ or more for maintaining the total characteristics as hard coating film. The flow rate is more preferably $1.1 \times 10^{-5}$ $(m^3/s)$ or more, and at the same time, it is more preferred to control the upper limit to $2.0 \times 10^{-5}$ $(m^3/s)$.

From the point of improvement in adhesion, it is preferred as mentioned above to form a coating film comprising a metal nitride on the surface of substrate by introducing nitrogen gas before introduction of the hydrocarbon gas. The metal target used in arc ion plating is preferably a Ti target. This is because the hard coating film formed is preferably titanium carbide or titanium carbonitride for attaining high hardness, and the coating film comprising a metal nitride formed under the hard coating film comprises preferably titanium nitride as aforementioned.

Furthermore, the hydrocarbon gas used for forming the hard coating film is preferably methane gas. Methane gas is preferred. Methane gas is easy in handling in arc ion plating, and can form efficiently carbon-carbon bonds in the hard coating film.

EXAMPLE 1

A sheet test piece (15 mm in width×18 mm in length×2 mm in thickness) and a disc test piece (20 mm in diameter×5 mm in thickness) which were made of JIS high speed tool steel SKH51 adjusted to 64 HRC in hardness were prepared as substrates to be subjected to surface treatment. The sheet test piece was for analysis of the coating film coated thereon, and the disc test piece was for evaluation testing of lubrication characteristics. The surface thereof was subjected to mechanical mirror polishing and then ultrasonic cleaning with an alkali.

Samples No. 1-9 each of which comprised a pair of the both substrates were subjected to degassing with heating at a temperature of 773K in a vacuum of $1 \times 10^{-3}$ Pa and cleaning with Ar plasma at a temperature of 723K in an arc ion plating apparatus of 1.4 $m^3$ in chamber capacity (insertion space for sample to be treated was 0.3 $m^3$). Then, various reaction gases were introduced into the apparatus, and arc discharge was generated on pure Ti target to carry out coating by arc ion plating at 723K. A bias voltage of −100 V was applied to the substrate during the coating, and coating time was adjusted so as to give a thickness of hard coating film of 2-3 µm. For Samples No. 1-8, only nitrogen gas was introduced [flow rate: 4.15 $(10^{-5}$ $m^3/s)$] before coating of hard coating film to form an intermediate coating film of about 1-2 µm thick comprising titanium nitride just on the substrate under the same coating conditions. As for the Sample No. 10 and Sample No. 11, the coating film was formed just on the substrate by CVD method and TD method, respectively. The coating conditions are shown in Table 1.

TABLE 1

| Sample No. | Coating method | Target/ coating metal | Methane gas flow rate (A) [$10^{-5}$ $m^3/s$] | Nitrogen gas flow rate (B) [$10^{-5}$ $m^3/s$] | (B)/(A) | (A)/chamber capacity [$\times 10^{-5}$ $s^{-1}$] | Note |
|---|---|---|---|---|---|---|---|
| 1 | Arc ion | Ti | 1.48 | 0 | 0 | 1.06 | The present |
| 2 | plating | | 1.45 | 0 | 0 | 1.06 | invention |

TABLE 1-continued

| Sample No. | Coating method | Target/coating metal | Methane gas flow rate (A) [$10^{-5}$ m$^3$/s] | Nitrogen gas flow rate (B) [$10^{-5}$ m$^3$/s] | (B)/(A) | (A)/chamber capacity [×$10^{-5}$ s$^{-1}$] | Note |
|---|---|---|---|---|---|---|---|
| 3 | | | 1.83 | 0.22 | 0.12 | 1.31 | |
| 4 | | | 1.50 | 0.35 | 0.23 | 1.07 | |
| 5 | | | 1.30 | 1.95 | 1.50 | 0.93 | |
| 6 | | | 2.16 | 0 | 0 | 1.54 | |
| 7 | | | 0.80 | 0 | 0 | 0.57 | Comparative example |
| 8 | | | 2.66 | 0 | 0 | 1.90 | |
| 9 | | | 0 | 4.15 | — | 0 | |
| 10 | CVD method | Ti | — | — | — | — | |
| 11 | TD method | V | — | — | — | — | |

The composition of the coating film formed on the uppermost surface of the sheet test piece was analyzed. First, identification of bond structure of carbons present on the surface of the coating film was conducted by Raman spectroscopic method. The apparatus used was type JRS-System 2000 manufactured by Nippon Denshi Co., Ltd. In advance, measurement on high-purity Si standard sample was carried out to confirm by He—Ne laser (wavelength 633 nm) that Raman peak intensity of Si appearing at a Raman shift of 520 cm$^{-1}$ was within the range of 70,000-80,000, and thereafter, when laser beam output at that time was assumed to be 100, measurement was conducted with laser beams of 25% output, and scanning was carried out once over 40 seconds through the range of Raman shift between 1000 cm$^{-1}$ and 2000 cm$^{-1}$.

Next, after confirming the results of the Raman spectroscopic analysis (mentioned hereinafter), successively, the same coating film was subjected to surface analysis by XPS. The apparatus used was AXIS-HS manufactured by Kratos Analytical Limited. Al was used for X-ray source, and accelerating voltage was 15 kV and emission current was 7 mA. The measuring area was 0.5 mm×0.2 mm, and immediately before the measurement, the coating film was dug down by sputtering from the uppermost surface layer for 10 minutes (about 10 nm; based on sputtering of 1 nm/min of high-purity SiO$_2$ standard sample) to remove impurities in the surface layer.

Using JIS bearing steel SUJ2 as other member, coefficient of dynamic friction was measured on the coating film on the surface of the disc test piece formed under the same conditions as for the sheet test piece, thereby to evaluate lubrication characteristics. The test conditions were as follows. Using a ball-on-disc type friction tester (Tribometer manufactured by CSM Instruments Co., Ltd.), the disc test piece was rotated at a rate of 150 mm/sec while pressing a ball of SUJ2 (6 mm in diameter) against the coating film under a load of 2N at room temperature in the air. The test distance was 100 m, and the coefficient of friction was an average value of the coefficients of friction at 10 m, 20 m, 30 m, 40 m, 50 m, 60 m, 70 m, 80 m, 90 m and 100 m.

Table 2 shows composition (constitution) and coefficient of friction of the uppermost hard coating film coated on each test piece. In Table 2, C-C indicates carbon atoms bonded to each other, and C—Ti (C-V in only the Sample No. 11) indicates carbon atom which forms carbide or carbonitride with metallic Ti (V in only the Sample No. 11). FIG. 1 shows spectrum of Sample No. 1 of the present invention and that of Sample No. 10 of Comparative Example as representative typical spectra of Raman spectroscopic analysis of the hard coating films obtained in this Example. In the case of Sample No. 1 of the present invention, there appear peaks of carbon-carbon bonds (sp$^2$ and sp$^3$ bonds shown by arrows). It was confirmed that the similar peaks were also obtained in Samples No. 2-6 and 8. On the other hand, there appear no peaks showing carbon-carbon bonds in Sample No. 10 of the Comparative Example. Furthermore, it was also confirmed that there appeared no peaks showing carbon-carbon bonds in Sample No. 7, 9 or 11.

TABLE 2

| Sample No. | Basic coating film constitution | Composition of coating film (at %) | | | | | Coefficient of friction | Note |
|---|---|---|---|---|---|---|---|---|
| | | C—C | C—Ti (V) | Ti (V) | O | N | | |
| 1 | TiC | 24.49 | 28.36 | 34.31 | 12.84 | 0 | 0.18 | The present invention |
| 2 | | 17.10 | 29.20 | 34.94 | 18.76 | 0 | 0.21 | |
| 3 | TiCN | 20.76 | 31.04 | 30.32 | 9.82 | 8.06 | 0.19 | |
| 4 | | 15.12 | 28.68 | 28.91 | 13.01 | 14.28 | 0.23 | |
| 5 | | 24.47 | 4.06 | 26.17 | 23.26 | 22.04 | 0.20 | |
| 6 | TiC | 27.80 | 30.65 | 32.28 | 9.27 | 0 | 0.22 | |
| 7 | | 8.17 | 39.89 | 39.98 | 11.96 | 0 | 0.44 | Comparative Example |
| 8 | | 33.27 | 29.10 | 30.05 | 7.58 | 0 | 0.23 | |
| 9 | TiN | 4.12 | 1.60 | 39.08 | 9.14 | 46.06 | 0.54 | |
| 10 | TiC | 4.07 | 39.67 | 44.62 | 10.81 | 0.83 | 0.25 | |
| 11 | VC | 4.63 | 41.46 | 47.16 | 6.16 | 0.59 | 0.30 | |

Among Samples No. 1-9 in which the hard coating film of an uppermost surface layer was formed by arc ion plating, in the case of Samples No. 1 and 2 where only methane gas was introduced into atmosphere during the coating, many carbon-carbon bonds were present in the coating film and the coefficient of friction was low. However, in Sample No. 2, since oxygen concentration in the coating film changed at high state, adhesion of the coating film was low as compared with that in Sample No. 1. In the case of Sample No. 3, nitrogen was present in the atmosphere during the coating, but the proportion of nitrogen (nitrogen gas flow rate/hydrocarbon gas flow rate) was controlled to a low level of 0.12, and since the amount of carbon-carbon bonds in the coating film was large, the coefficient of friction was low. In the case of Sample No. 4 in which the proportion of nitrogen gas in the coating atmosphere was increased as compared with Sample No. 3, the (B)/(A) value was high, namely, 0.23, but carbon atoms having carbon-carbon bonds were given in a sufficient amount, and hence a low coefficient of friction was obtained.

In the case of Sample No. 5 where nitrogen was present in the coating atmosphere, the flow rate of methane gas was decreased and the flow rate of nitrogen gas was increased, and thus the (B)/(A) value was high and (A)/(chamber capacity) value was low. Therefore, the amount of titanium carbonitride produced was small, but since a sufficient amount of carbon atoms having carbon-carbon bonds were given and thus also a low coefficient of friction was obtained. On the other hand, Sample No. 6 produced with increasing the flow rate of methane gas was high in (A)/(chamber capacity) value, and hence many carbon-carbon bonds were present in the coating film and a sufficient frictional characteristics were obtained. However, soot material was formed on the surface of the sample, which affected not only the appearance of product, but also necessitated cleaning of chamber. Thus, this sample was not practical considering production efficiency.

On the other hand, in the case of Sample No. 7, the methane gas flow rate was low, and hence carbon-carbon bonds were not obtained in a sufficient amount in the coating film. In Sample No. 8 which was prepared with a high methane gas flow rate for chamber capacity and was high in the value of (A)/(chamber capacity), a sufficient amount of carbon-carbon bond was obtained, but soot was produced in a large amount and properties of the film were not proper. Sample No. 9 prepared without introducing methane gas during the arc ion plating was a coating film formed of mainly TiN, and a sufficient amount of carbon-carbon bond was not detected in the film and the film had a high coefficient of friction.

Sample No. 10 which was a coating film formed by CVD method was less in carbon-carbon bond and insufficient in lubrication characteristics. Sample No. 11 which was a coating film formed by TD method was a coating film mainly composed of V carbide, which was also less in carbon-carbon bond present and insufficient in lubrication characteristics.

EXAMPLE 2

As substrates to be subjected to surface treatment, test pieces comprising combination of a pair of the two test pieces used in Example 1 were newly prepared as Sample No. 12.

The Sample No. 12 was subjected to degassing with heating at a temperature of 773K in a vacuum of $1\times10^{-3}$ Pa and cleaning with Ar plasma at a temperature of 723K in an arc ion plating apparatus of 1.4 m$^3$ in chamber capacity (insertion space for sample to be treated was 0.3 m$^3$). Then, reaction gas was introduced into the apparatus, and arc discharge was generated on pure Ti target to carry out coating by arc ion plating at 723K. A bias voltage of −100 V was applied to the substrate during the coating to form a hard coating film just on the substrate. The coating time was adjusted so as to give a thickness of the hard coating film of about 2-3 μm. The coating conditions are shown in Table 3.

TABLE 3

| Sample No. | Coating method | Target | Methane gas flow rate (A) [$10^{-5}$ m$^3$/s] | Nitrogen gas flow rate (B) [$10^{-5}$ m$^3$/s] | (B)/(A) | (A)/chamber capacity [$\times 10^{-5}$ s$^{-1}$] | Note |
|---|---|---|---|---|---|---|---|
| 12 | Arc ion plating | Ti | 1.50 | 0 | 0 | 1.07 | The present invention |

First, identification of bond structure of carbons present on the surface of the hard coating film of Sample No. 12 was conducted by Raman spectroscopic method in accordance with Example 1. As a result, there appeared the both bond peaks of sp$^2$ and sp$^3$ showing carbon-carbon bonds (FIG. 2).

Successively, surface analysis of the hard coating film was conducted by XPS in the same manner as in Example 1. Furthermore, lubrication characteristics were evaluated by measurement of coefficient of dynamic friction in the same manner as in Example 1. Table 4 shows the compositions (constitutions) of the hard coating film and the results of evaluation of coefficient of friction. Table 4 additionally shows the results of evaluation of Samples No. 10 and 11 which were comparative samples evaluated on Example 1.

TABLE 4

| Sample No. | Basic coating film constitution | Composition of coating film (at %) | | | | | Coefficient of friction | Note |
|---|---|---|---|---|---|---|---|---|
| | | C—C | C—Ti (V) | Ti (V) | O | N | | |
| 12 | TiC | 22.16 | 33.34 | 31.92 | 8.37 | 0 | 0.15 | The present invention |
| 10 | TiC | 4.07 | 39.67 | 44.62 | 10.81 | 0.83 | 0.25 | Comparative |
| 11 | VC | 4.63 | 41.46 | 47.16 | 6.16 | 0.59 | 0.30 | example |

The Sample No. 12 of the present invention in which the coating film was formed by arc ion plating as in Example 1 had sufficiently many carbon-carbon bonds present on the surface of the hard coating film and had low coefficient of friction.

INDUSTRIAL APPLICABILITY

The present invention can be applied to working surface of tools used for plastic working of metal such as cold forging or warm or hot forging or press working. Furthermore, considering the sliding characteristics of the coating film, the present invention can also be applied to working surface of casting members used in contact with molten metal such as molds used for die casting and cast molding, casting pins and piston rings used for injector of die cast. Moreover, the present invention can be applied to, for example, sliding parts or cutting blades as jigs and tools other than molds.

Figure 1:
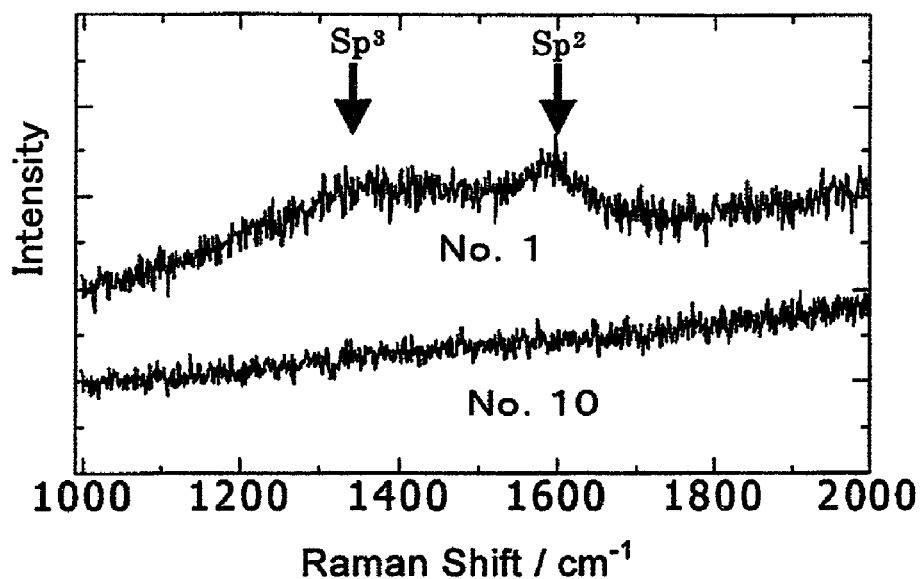
[FIG. 1] A graph which shows one example of spectra in Raman spectroscopic analysis which were obtained on the hard coating films of the present invention and comparative examples.
Figure 2:
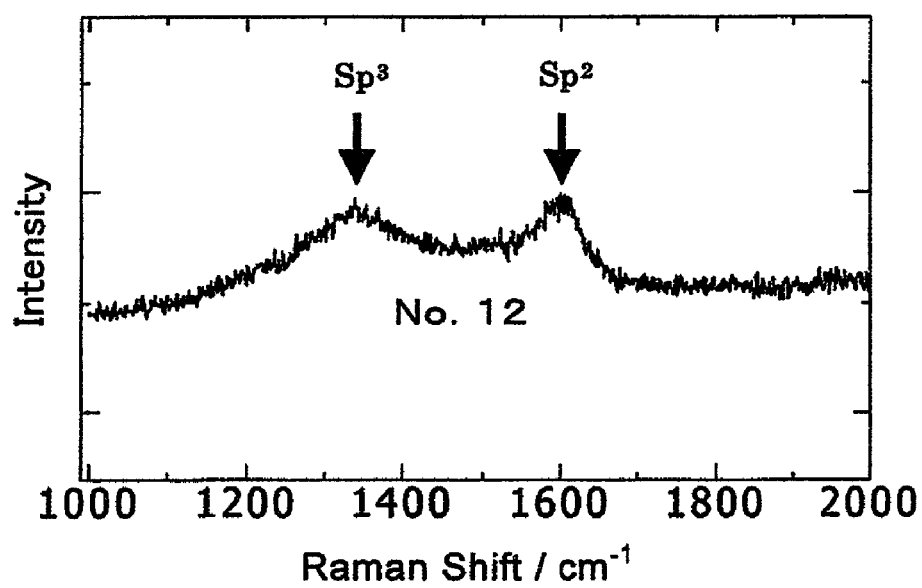
[FIG. 2] A graph which shows one example of spectrum in Raman spectroscopic analysis which was obtained on the hard coating film of the present invention.

The invention claimed is:

1. A hard film covering the surface of a substrate coming into contact with another member and excellent in lubrication characteristics, comprising a hard coating film, an intermediate coating film, and a substrate, wherein the hard coating film comprises carbon atoms having carbon-carbon bonds are dispersed in the hard coating film in an amount of 10 at % or more and 30 at % or less, and wherein the carbon atoms having carbon-carbon bonds include both carbon atoms having a crystal structure $sp^2$ and carbon atoms having a crystal structure of $sp^3$, wherein the intermediate coating film comprising a metal nitride, and wherein the hard coating film is provided directly on the intermediate coating film, the intermediate coating film is provided directly on the surface of the substrate, and the hard coating film is the outermost surface.

2. The hard film excellent in lubrication characteristics according to claim 1, wherein the hard coating film comprises a metal carbide or a metal carbonitride.

3. The hard film excellent in lubrication characteristics according to claim 2, wherein the amount of carbon which forms the metal carbide or metal carbonitride is 20 at % or more.

4. The hard film excellent in lubrication characteristics according to claim 2, wherein the metal carbide or metal carbonitride is titanium carbide or titanium carbonitride.

5. The hard film excellent in lubrication characteristics according to claim 1, wherein oxygen concentration in the hard coating film is 15 at % or less.

6. The hard film excellent in lubrication characteristics according to claim 1, wherein the metal nitride is titanium nitride.

7. A process for producing a hard coating film excellent in lubrication characteristics on the surface of a substrate by arc ion plating, wherein the process comprises introducing a nitrogen gas to form an intermediate coating film on the surface of the substrate, followed by introducing a hydrocarbon gas during the arc ion plating with a metal target to form on the intermediate coating film a coating film where carbon atoms having carbon-carbon bonds are dispersed in the hard coating film in an amount of 10 at % or more and 30 at % or less, wherein the flow rate of the hydrocarbon gas with respect to capacity of the arc ion plating apparatus is shown by hydrocarbon gas flow rate/apparatus capacity = $0.8 \times 10^{-5}$ to $1.5 \times 10^{-5} (s^{-1})$, and wherein the carbon atoms having carbon-carbon bonds include both carbon atoms having a crystal structure $sp^2$ and carbon atoms having a crystal structure of $sp^3$.

8. A process for producing a hard coating film excellent in lubrication characteristics according to claim 7, wherein the flow rate of the hydrocarbon gas is $1.0 \times 10^{-5} (m^3/s)$ or more.

9. A process for producing a hard coating film excellent in lubrication characteristics according to claim 7, wherein the hard coating film is formed with controlling the amount of nitrogen gas included in the hydrocarbon gas introduced to 0.2 or less in the ratio of nitrogen gas flow rate/hydrocarbon gas flow rate.

10. A process for producing a hard coating film excellent in lubrication characteristics according to claim 7, wherein the metal target used is a Ti target.

11. A process for producing a hard coating film excellent in lubrication characteristics according to claim 7, wherein the hydrocarbon gas introduced is methane gas.

12. A tool for plastic working of metal whose working surfaces are coated with the hard coating film according to any one of claim 1, 2-5 or 6.

* * * * *